United States Patent
Li et al.

(10) Patent No.: US 12,125,890 B2
(45) Date of Patent: *Oct. 22, 2024

(54) SEMICONDUCTOR DEVICE AND METHOD FOR FABRICATING THE SAME

(71) Applicant: UNITED MICROELECTRONICS CORP., Hsin-Chu (TW)

(72) Inventors: Yi-Fan Li, Tainan (TW); Wen-Yen Huang, Changhua County (TW); Shih-Min Chou, Tainan (TW); Zhen Wu, Kaohsiung (TW); Nien-Ting Ho, Tainan (TW); Chih-Chiang Wu, Tainan (TW); Ti-Bin Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/226,264

(22) Filed: Jul. 26, 2023

(65) Prior Publication Data

US 2023/0369442 A1 Nov. 16, 2023

Related U.S. Application Data

(60) Continuation of application No. 17/709,385, filed on Mar. 30, 2022, now Pat. No. 11,757,016, which is a continuation of application No. 16/907,287, filed on Jun. 21, 2020, now Pat. No. 11,322,598, which is a division of application No. 16/177,368, filed on Oct. 31, 2018, now Pat. No. 10,734,496.

(30) Foreign Application Priority Data

Oct. 3, 2018 (TW) ................................. 107134933

(51) Int. Cl.
H01L 29/49 (2006.01)
H01L 27/092 (2006.01)
H01L 29/40 (2006.01)

(52) U.S. Cl.
CPC ........ H01L 29/4966 (2013.01); H01L 27/092 (2013.01); H01L 29/401 (2013.01)

(58) Field of Classification Search
None
See application file for complete search history.

(56) References Cited

U.S. PATENT DOCUMENTS

| 6,921,711 | B2 | 7/2005 | Cabral, Jr. et al. |
| 7,682,891 | B2* | 3/2010 | Lavoie ............ H01L 21/823842 257/E29.264 |
| 8,853,068 | B2 | 10/2014 | Hsu |
| 9,293,461 | B2* | 3/2016 | Kwon ............. H01L 21/823842 |

(Continued)

FOREIGN PATENT DOCUMENTS

CN 109037046 A 12/2018

*Primary Examiner* — Long Pham
(74) *Attorney, Agent, or Firm* — Winston Hsu

(57) ABSTRACT

A method for fabricating semiconductor device includes the steps of first providing a substrate having a first region and a second region, forming a first bottom barrier metal (BBM) layer on the first region and the second region, forming a first work function metal (WFM) layer on the first BBM layer on the first region and the second region, and then forming a diffusion barrier layer on the first WFM layer.

6 Claims, 5 Drawing Sheets

(56) References Cited

U.S. PATENT DOCUMENTS

| | | |
|---|---|---|
| 9,384,986 B2 * | 7/2016 | Yin .................. H01L 21/823842 |
| 9,601,388 B2 | 3/2017 | Chen |
| 11,257,953 B2 | 2/2022 | Wu |
| 2012/0261770 A1 | 10/2012 | Lin et al. |
| 2014/0015063 A1 * | 1/2014 | Yang ............... H01L 21/823842 |
| | | 257/369 |
| 2015/0102416 A1 * | 4/2015 | Yin ................... H01L 21/28088 |
| | | 257/369 |
| 2016/0293490 A1 * | 10/2016 | Chen ..................... H01L 29/401 |
| 2020/0006153 A1 * | 1/2020 | Lee ................. H01L 21/823431 |
| 2021/0125927 A1 | 4/2021 | Chen |

* cited by examiner

US 12,125,890 B2

SEMICONDUCTOR DEVICE AND METHOD FOR FABRICATING THE SAME

CROSS REFERENCE TO RELATED APPLICATIONS

This application is a continuation application of U.S. application Ser. No. 17/709,385, filed on Mar. 30, 2022, which is a continuation application of U.S. application Ser. No. 16/907,287, filed on Jun. 21, 2020, which is a division of U.S. application Ser. No. 16/177,368, filed on Oct. 31, 2018. The contents of these applications are incorporated herein by reference.

BACKGROUND OF THE INVENTION

1. Field of the Invention

The invention relates to a method for fabricating semiconductor device, and more particularly to a method for fabricating metal gate transistor.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal transistor, particularly during the stage when spacer is formed on the sidewall of gate structure, issues such as over-etching or undercut often arise and causing etching gas to etch through spacer until reaching the bottom of the gate structure. This induces erosion in high-k dielectric layer and/or bottom barrier metal (BBM) and affects the performance of the device substantially. Hence, how to resolve this issue has become an important task in this field.

SUMMARY OF THE INVENTION

According to an embodiment of the present invention, a method for fabricating semiconductor device includes the steps of first providing a substrate having a first region and a second region, forming a first bottom barrier metal (BBM) layer on the first region and the second region, forming a first work function metal (WFM) layer on the first BBM layer on the first region and the second region, and then forming a diffusion barrier layer on the first WFM layer.

According to another aspect of the present invention, a semiconductor device includes a substrate having a first region and a second region and a gate structure on the first region and the second region of the substrate. Preferably, the gate structure includes a first bottom barrier metal (BBM) layer on the first region and the second region, a first work function metal (WFM) layer on the first region, a diffusion barrier layer on the first WFM layer, and a second WFM layer on a top surface and a sidewall of the diffusion barrier layer.

According to yet another aspect of the present invention, a semiconductor device includes a substrate having a first region and a second region and a gate structure on the first region and the second region of the substrate. Preferably, the gate structure includes a first bottom barrier metal (BBM) layer on the first region and the second region as a thickness of the first BBM layer on the second region is less than a thickness of the first BBM layer on the first region, a first work function metal (WFM) layer on the first region, and a diffusion barrier layer contacts a surface of the first WFM layer on the first region and the first BBM layer on the second region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
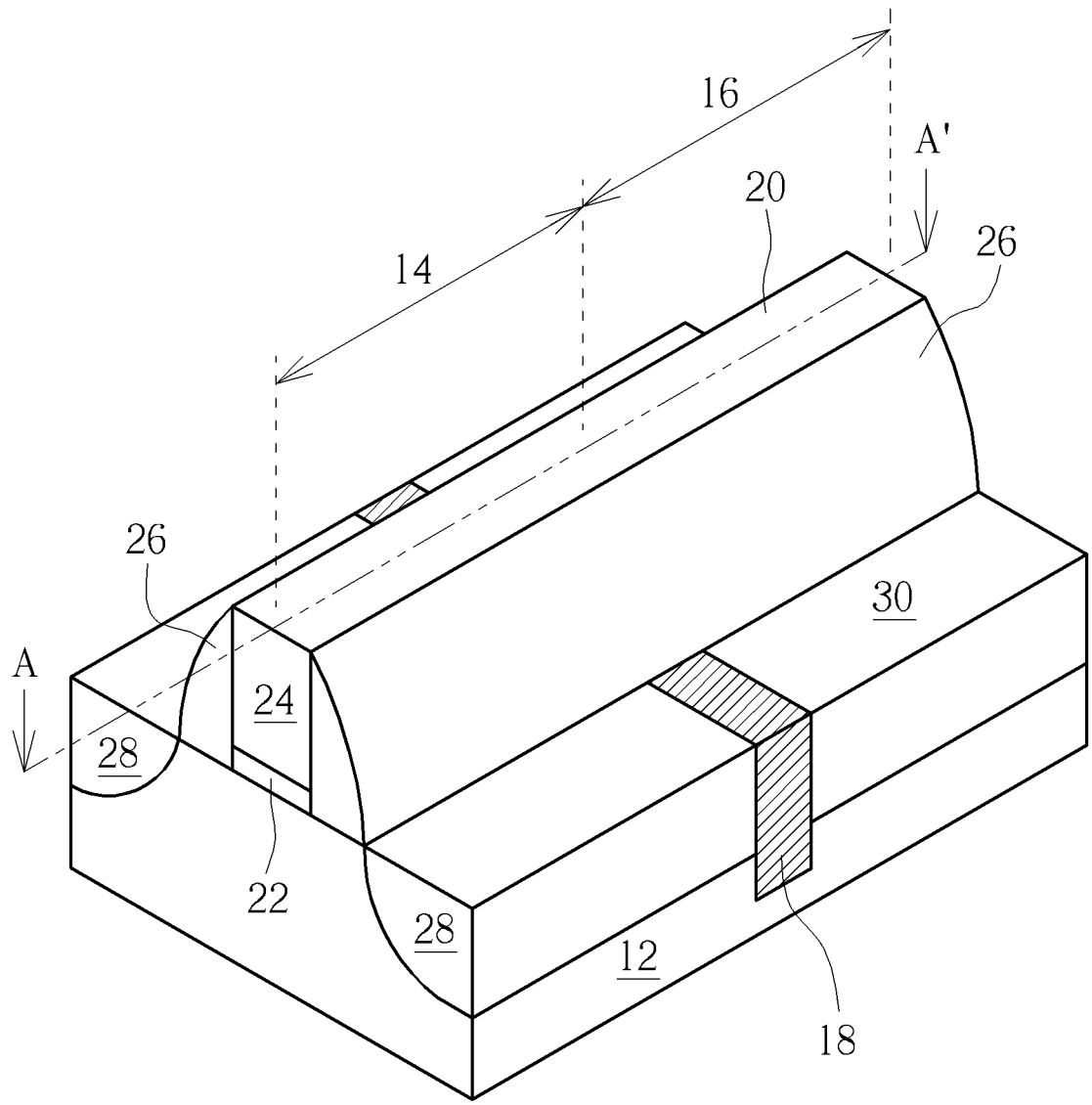
FIGS. 1-5 illustrate a method for fabricating semiconductor device according to an embodiment of the present invention.

Referring to FIGS. 1-5, FIGS. 1-5 illustrate a method for fabricating semiconductor device according to an embodiment of the present invention. As shown in FIG. 1, a substrate 12 such as a silicon substrate or silicon-on-insulator (SOI) substrate is provided, a first region such as a PMOS region 14 and a second region such as a NMOS region 16 are defined on the substrate 12, and a shallow trench isolation (STI) 18 is formed in the substrate 12 to divide the PMOS region 14 and the NMOS region 16. Next, at least a gate structure 20 is formed on the substrate 12 and extending across the PMOS region 14 and the NMOS region 16. In this embodiment, the formation of the gate structure 20 could be accomplished by sequentially forming a gate dielectric layer, a gate material layer, and a selective hard mask on the substrate 12, conducting a pattern transfer process by using a patterned resist (not shown) as mask to remove part of the hard mask, part of the gate material layer, and part of the gate dielectric layer through single or multiple etching processes, and then stripping the patterned resist. This forms a gate structure 20 composed of a patterned gate dielectric layer 22, a patterned gate material layer 24, and a patterned hard mask (not shown) on the substrate 12.

It should be noted that even though the present embodiment pertains to a planar MOS transistor, according to another embodiment of the present invention, the present invention could also be applied to a non-planar MOS transistor such as fin field effect transistor (FinFET) devices, which is also within the scope of the present invention.

Next, at least a spacer 26 is formed on sidewalls of the gate structure 20, source/drain regions 28, 30 and/or epitaxial layer (not shown) are formed in the substrate 12 adjacent to two sides of the spacer 26 on the PMOS region 14 and NMOS region 16 respectively, and a selective silicide layer (not shown) could be formed on the surface of the source/drain regions 28, 30. In this embodiment, the spacer 26 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example SiO$_2$, SiN, SION, SiCN, or combination thereof. The source/drain regions 28, 30 could include dopants and epitaxial material of different conductive type depending on the type of device being fabricated. For example, the source/drain region 28 on the PMOS region 14 could include p-type dopants and/or silicon germanium (SiGe) while the source/drain region 30 on the NMOS region 16 could include n-type dopants, SiC, and/or SiP, but not limited thereto.

Figure 2:
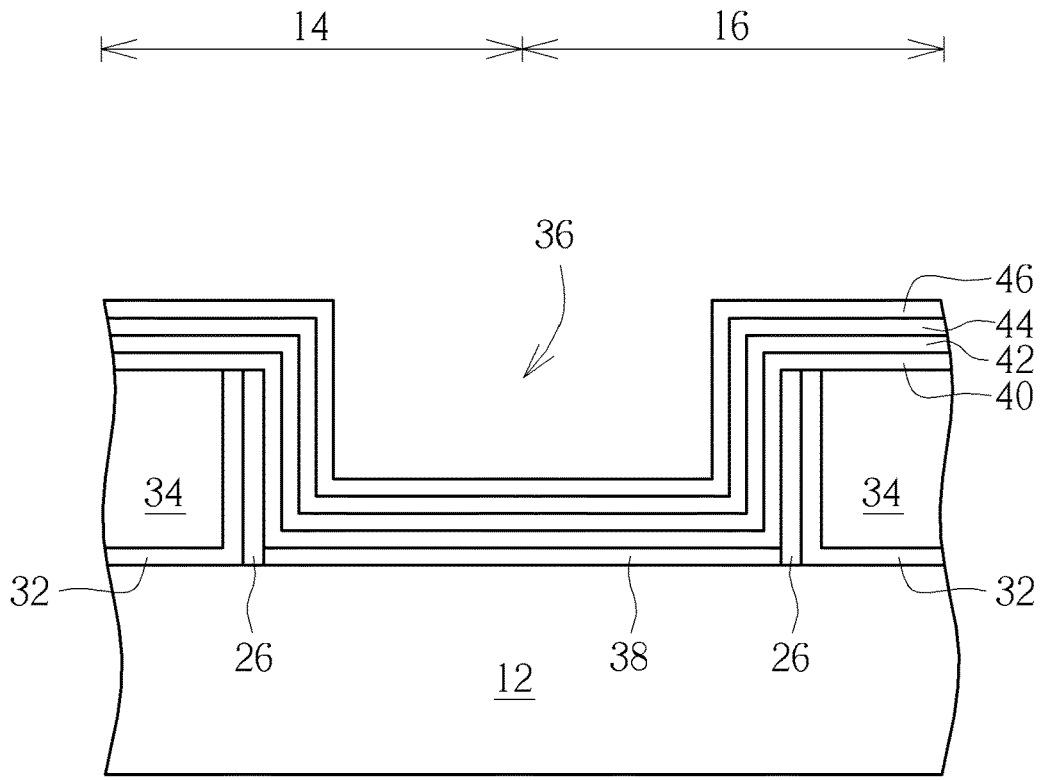

Next, referring to FIGS. 2-5, FIGS. 2-5 illustrate follow-up fabrication processes taken along the longer axis of gate structure 20 or along the sectional line AA' shown in FIG. 1. As shown in FIG. 2, a contact etch stop layer (CESL) 32 is formed on the surface of the substrate 12 and the gate structure 20 and an interlayer dielectric (ILD) layer 34 is formed on the CESL 32 thereafter. Next, a planarizing process such as chemical mechanical polishing (CMP) process is conducted to remove part of the ILD layer 34 and part of the CESL 32 to expose the gate material layer 24 made of polysilicon and the top surface of the gate material 24 is even with the top surface of the ILD layer 34.

Next, a replacement metal gate (RMG) process is conducted to transform the gate structure 20 into metal gate. For instance, the RMG process could be accomplished by first performing a selective dry etching or wet etching process using etchants including but not limited to for example ammonium hydroxide (NH$_4$OH) or tetramethylammonium hydroxide (TMAH) to remove the gate material layer 24 and even gate dielectric layer 22 of the gate structure 20 for forming a recess 36 in the ILD layer 34 on both PMOS region 1 4 and NMOS region 16 at the same time. Next, a selective interfacial layer 38 or gate dielectric layer, a high-k dielectric layer 40, a bottom barrier metal (BBM) layer 42, another BBM layer 44, and a work function metal layer 46 are formed in the recess 36.

In this embodiment, the high-k dielectric layer 40 is preferably selected from dielectric materials having dielectric constant (k value) larger than 4. For instance, the high-k dielectric layer 40 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBizTa-zOg, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

Preferably, the BBM layer 42 and the BBM layer 44 could be made of same material or different material depending on the demand of the product while both layers 42, 44 could all be selected from the group consisting of Ti, TiN, Ta, and TaN. The work function metal layer 46 at this stage is preferably a p-type work function metal layer having a work function ranging between 4.8 eV and 5.2 eV, which may include but not limited to for example titanium nitride (TiN), tantalum nitride (TaN), or tantalum carbide (TaC).

Figure 3:
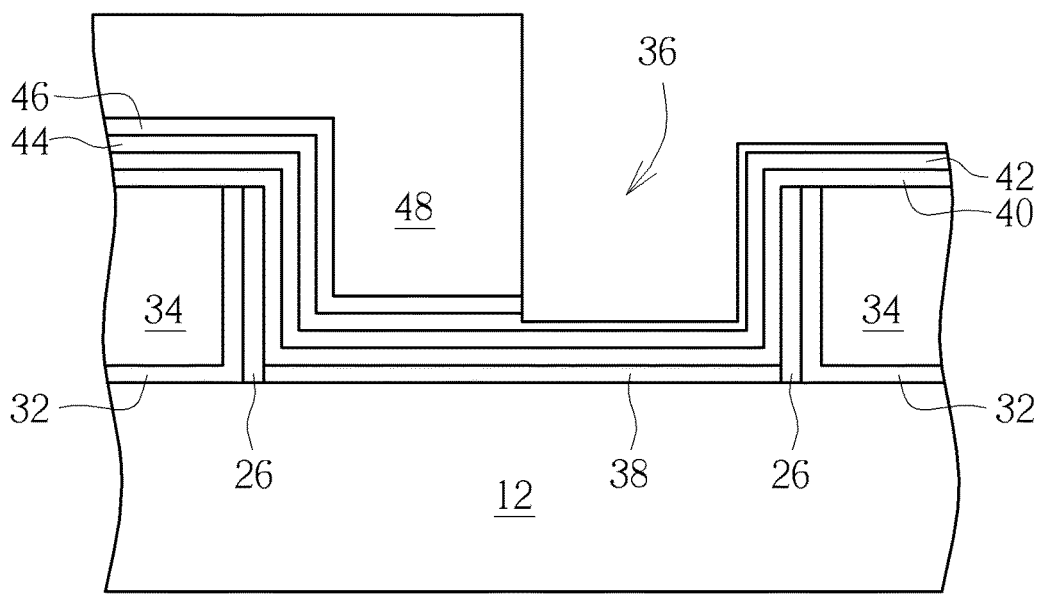

Next, as shown in FIG. 3, a patterned mask such as a patterned resist 48 is formed to cover the PMOS region 14, and an etching process is conducted by using the patterned resist 48 as mask to remove the work function metal layer 46 and part of the BBM layer 44 on the NMOS region 16. It should be noted that the etching process conducted as this stage is preferably an over-etching process such that after removing all of work function metal layer 46 on the NMOS region 16 some of the BBM layer 44 on the NMOS region 16 is removed thereafter. This exposes part of the sidewall of the BBM layer 44 on the PMOS region and reduces the overall thickness of the BBM layer 44 on NMOS region 16 so that the remaining thickness of the BBM layer 44 on NMOS region 16 is slightly less than the thickness of the BBM layer 44 on PMOS region 14. The patterned resist 48 is stripped thereafter.

Figure 4:
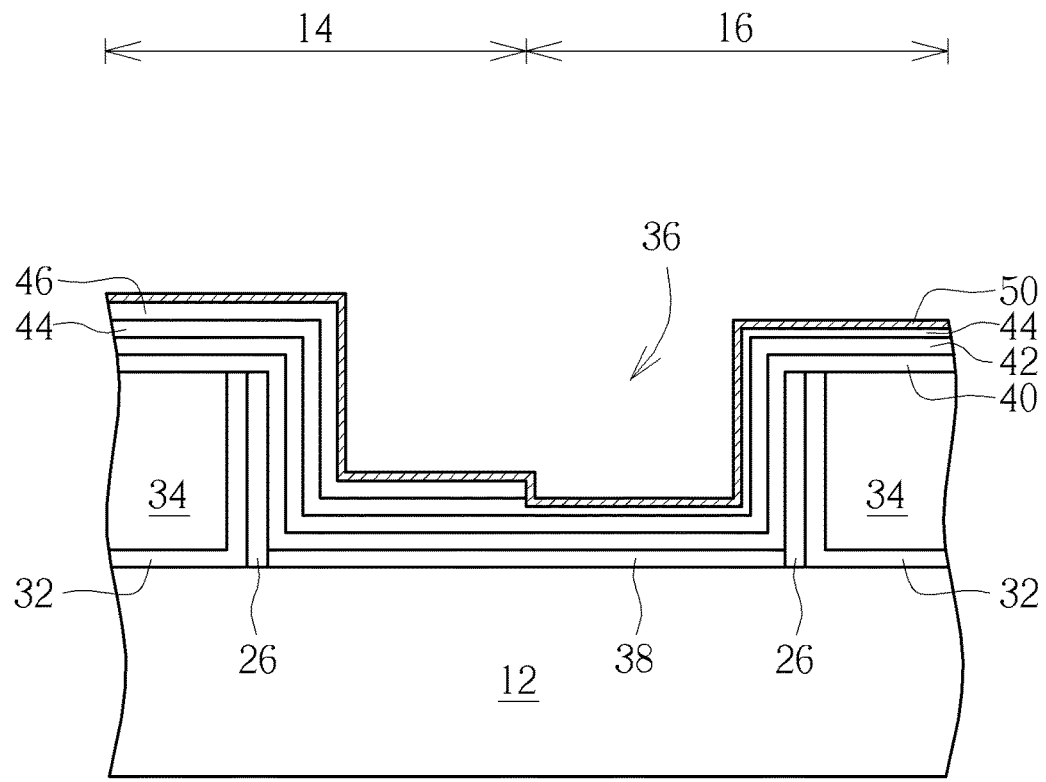

Next as shown in FIG. 4, a diffusion barrier layer 50 is formed on the surfaces of the work function metal layer 46 on PMOS region 14 and the BBM layer 44 on NMOS region 16. It should be noted that since part of the BBM layer 44 on NMOS region 16 has been removed by the aforementioned etching process, the diffusion barrier layer 50 at this stage is preferably formed on the top surface of the work function metal layer 46 on PMOS region 14, a sidewall of the work function metal layer 46 on PMOS region 14, a sidewall of the BBM layer 44 on PMOS region 14, and the top surface of the BBM layer 44 on NMOS region 16. Viewing from another perspective, the diffusion barrier layer 50 is formed to extend from the PMOS region 14 to the NMOS region 16 and covering the work function metal layer 46 on PMOS region 14, the BBM layer 44 on NMOS region 16, and sidewalls of the work function metal layer 46 and BBM layer 44 at the intersecting point between PMOS region 14 and NMOS region 16 at the same time. Preferably, the BBM layer 44 and the diffusion barrier layer 50 are made of same material such as but not limited to for example TaN.

Figure 5:
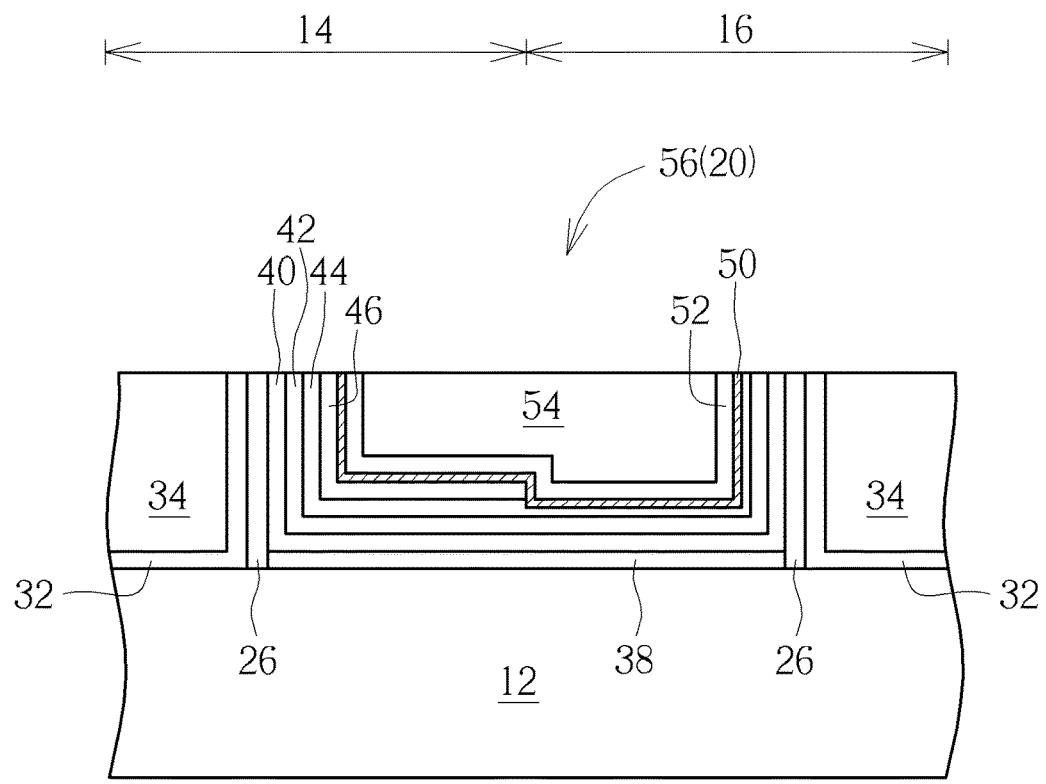

Next, as shown in FIG. 5, another work function metal layer 52 and a low resistance metal layer 54 are sequentially formed on the surface of the diffusion barrier layer 50 on both PMOS region 14 and NMOS region 16, and a planarizing process such as CMP is conducted to remove part of the low resistance metal layer 54, part of the work function metal layer 52, part of the diffusion barrier layer 50, part of the BBM layer 44, part of the BBM layer 42, and part of the high-k dielectric layer 40 to form metal gate 56.

Preferably, the work function metal layer 52 is a n-type work function metal layer having work function ranging between 3.9 eV and 4.3 eV, which may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but not limited thereto. The low-resistance metal layer 54 could include copper (Cu), aluminum (Al), titanium aluminum (TiAl), cobalt tungsten phosphide (CoWP) or any combination thereof.

Next, a pattern transfer process could be conducted by using patterned mask to remove part of the ILD layer 34 and part of the CESL 32 adjacent to the metal gate 56 to form contact holes (not shown) exposing the source/drain regions 28, 30 underneath. Next, metals such as a barrier layer including Ti, TiN, Ta, TaN, or combination thereof and a metal layer including W, Cu, Al, TiAl, CoWP, or combination thereof could be deposited into the contact holes, and a planarizing process such as CMP is conducted to remove part of the metals to form contact plugs electrically connecting the source/drain regions 28, 30. This completes the fabrication of a semiconductor device according to an embodiment of the present invention.

Referring again to FIG. 5, FIG. 5 further illustrates a structural view of a semiconductor device according to an embodiment of the present invention. As shown in FIG. 5, the semiconductor device preferably includes a gate structure 20 or metal gate 56 disposed on the substrate 12 while the gate structure 20 extends or laterally crossing the PMOS region 14 and NMOS region 16 at the same time. Preferably, the gate structure 20 includes an interfacial layer 38 or gate dielectric layer extending from the PMOS region 14 to the NMOS region 16, a high-k dielectric layer 40 extending from the PMOS region 14 to the NMOS region 16, a BBM layer 42 extending from the PMOS region 14 to the NMOS region 16, another BBM layer 44 extending from the PMOS region 14 to the NMOS region 16, a work function metal layer 46 disposed on the PMOS region 14, a diffusion barrier layer 50 extending from the PMOS region 14 to the NMOS region 16, another work function metal layer 52 extending from the PMOS region 14 to the NMOS region 16, and a low resistance metal layer 54 extending from the PMOS region 14 to the NMOS region 16.

Viewing from a more detailed perspective, the high-k dielectric layer 40 is extended from the PMOS region 14 to NMOS region 16 and disposed on the surface of the interfacial layer 38, the BBM layer 42 is extended from the PMOS region 14 to NMOS region 16 and directly contacting the surface of the high-k dielectric layer 40, the BBM layer 44 is extended from the PMOS region 14 to NMOS region 16 and directly contacting the surface of the BBM layer 42, the work function metal layer 46 is only disposed on the PMOS region 14 and directly contacting the surface of the BBM layer 44 on PMOS region 14 without extending to the NMOS region 16, the diffusion barrier layer 50 is extended from the PMOS region 14 to NMOS region 16 and directly contacting the top surface of the work function metal layer 46 on PMOS region, a sidewall of the work function metal layer 46 on PMOS region 14 (or more specifically on the intersecting point between PMOS region 14 and NMOS region 16), a sidewall of the BBM layer 44 on PMOS region 14 (or more specifically on the intersecting point between PMOS region 14 and NMOS region 16), and the top surface of BBM layer 44 on NMOS region 16, the work function metal layer 52 is extended from the PMOS region 14 to NMOS region 16 and directly contacting the top surface of the diffusion barrier layer 50, and the low resistance metal layer 54 is extended from the PMOS region 14 to NMOS region 16 and directly contacting the surface of the work function metal layer 52.

It should be noted that the thickness of the BBM layer 44 on NMOS region 16 is preferably less than the thickness of the BBM layer 44 on PMOS region 14 or more specifically the thickness of the BBM layer 44 on NMOS region 16 is approximately half the thickness of the BBM layer 44 on PMOS region 14, and at the same time the thickness of the diffusion barrier layer 50 is preferably equal to the thickness of the BBM layer 44 on NMOS region 16 or half the thickness of the BBM layer 44 on PMOS region 14. In other word, the total thickness of the BBM layer 44 and diffusion barrier layer 50 combined on NMOS region 16 is preferably equal to the total thickness of a single BBM layer 44 on PMOS region 14.

Figure 6:
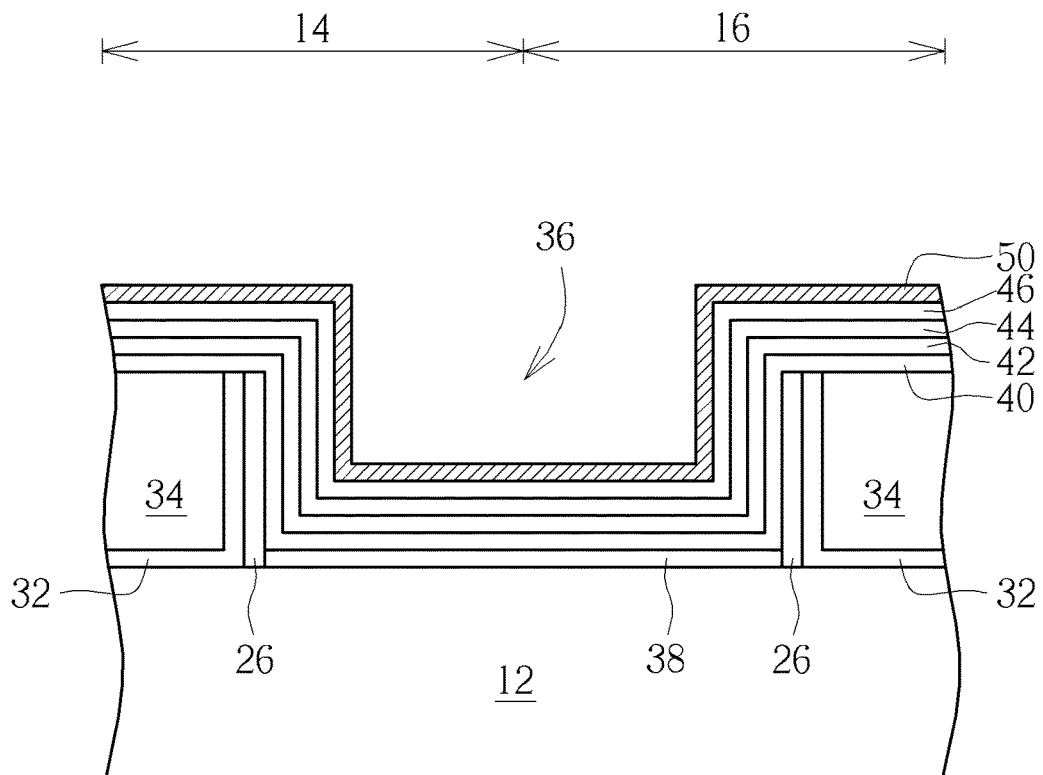
FIGS. 6-8 illustrate a method for fabricating semiconductor device according to an embodiment of the present invention.
Figure 7:
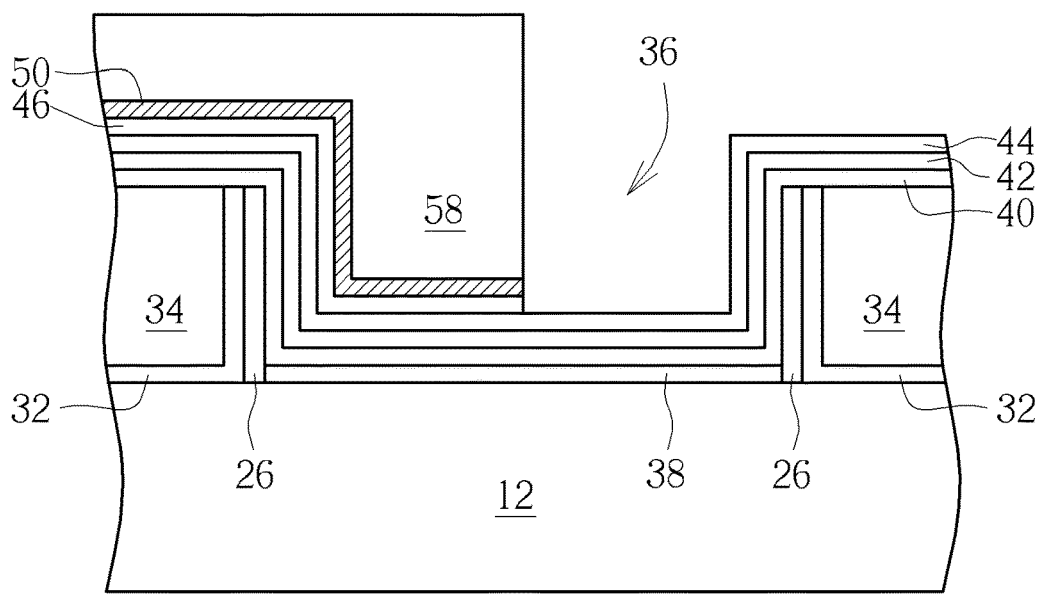
Figure 8:
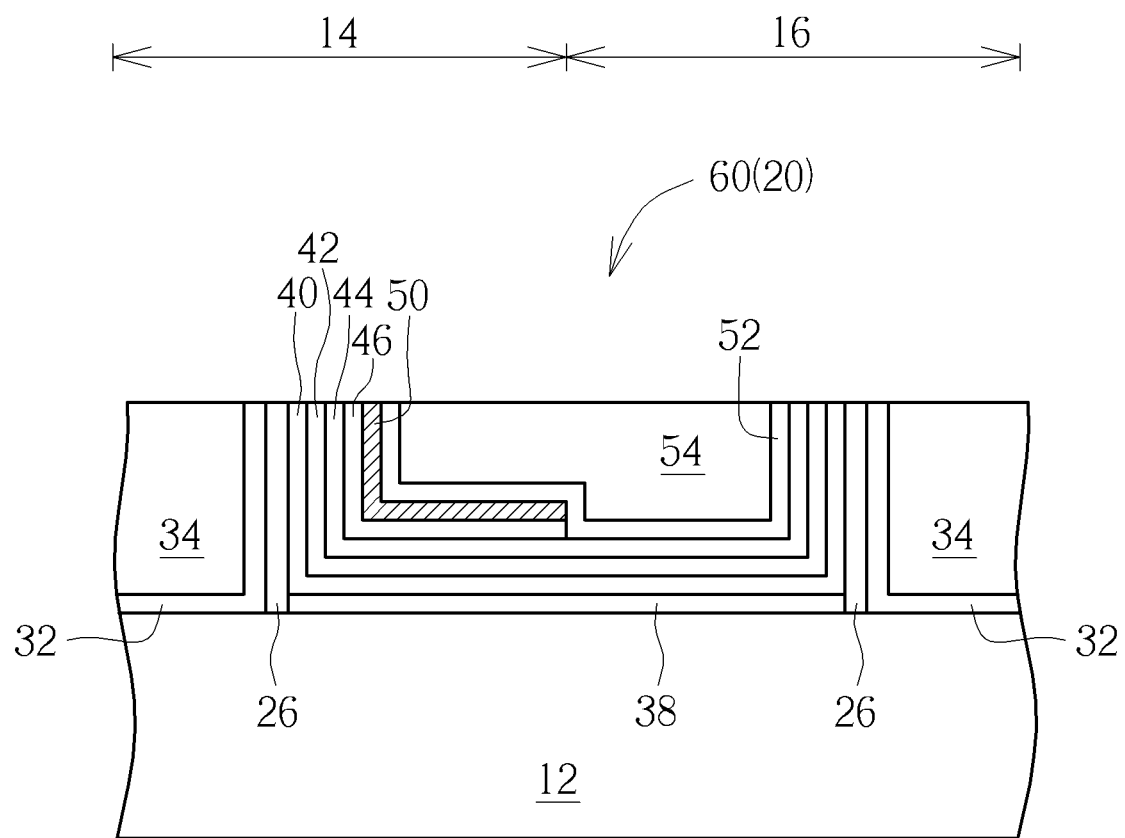

Referring to FIGS. 6-8, FIGS. 6-8 illustrate a method for fabricating semiconductor device according to an embodiment of the present invention. As shown in FIG. 6, it would be desirable to sequentially form an interfacial layer 38, a high-k dielectric layer 40, a BBM layer 42, another BBM layer 44, and a work function metal layer 46 on both PMOS region 14 and NMOS region 16 as shown in FIG. 2 and then directly form a diffusion barrier layer 50 on the surface of the work function metal layer 46 on both PMOS region 14 and NMOS region 16.

Next, as shown in FIG. 7, a patterned mask such as a patterned resist 58 is formed to cover the PMOS region 14, and an etching process is conducted by using the patterned resist 58 as mask to remove the diffusion barrier layer 50 and the work function metal layer 46 on NMOS region 16 to expose the surface of the BBM layer 44 underneath. The patterned resist 58 is stripped thereafter.

Next, as shown in FIG. 8, another work function metal layer 52 and a low resistance metal layer 54 are formed on the surface of the diffusion barrier layer 50 on PMOS region 14 and the surface of the BBM layer 44 on NMOS region 16, and a planarizing process such as CMP is conducted to remove part of the low resistance metal layer 54, part of the work function metal layer 52, part of the diffusion barrier layer 50, part of the work function metal layer 46, part of the BBM layer 44, part of the BBM layer 42, and part of the high-k dielectric layer 40 to form metal gate 60.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a substrate having a first region and a second region;
a gate structure on the first region and the second region of the substrate, wherein the gate structure comprises:
a first bottom barrier metal (BBM) layer on the first region and the second region;
a first work function metal (WFM) layer on the first region;
a diffusion barrier layer on the first WFM layer, wherein sidewalls of the diffusion barrier layer and the first WFM layer are aligned; and
a second WFM layer on the diffusion barrier layer.
2. The semiconductor device of claim 1, further comprising a low resistance metal layer on the second WFM layer.
3. The semiconductor device of claim 1, wherein the first WFM layer comprises a p-type WFM layer and the second WFM layer comprises a n-type WFM layer.
4. The semiconductor device of claim 1, wherein the first BBM layer and the diffusion barrier layer comprise a same material.
5. The semiconductor device of claim 1, further comprising a second BBM layer between the first BBM layer and the substrate.
6. The semiconductor device of claim 5, wherein the first BBM layer and the second BBM layer comprise different materials.

* * * * *